US009660650B1

(12) United States Patent
Manohararajah et al.

(10) Patent No.: US 9,660,650 B1
(45) Date of Patent: May 23, 2017

(54) INTEGRATED CIRCUITS WITH IMPROVED REGISTER CIRCUITRY

(71) Applicant: Altera Corporation, San Jose, CA (US)

(72) Inventors: Valavan Manohararajah, Scarborough (CA); Jeffrey Christopher Chromczak, Toronto (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/209,503

(22) Filed: Mar. 13, 2014

(51) Int. Cl.
  *H03K 19/173* (2006.01)
  *H03K 19/0175* (2006.01)
  *G06F 17/50* (2006.01)

(52) U.S. Cl.
  CPC ... *H03K 19/017581* (2013.01); *G06F 17/505* (2013.01)

(58) Field of Classification Search
  None
  See application file for complete search history.

(56) References Cited

U.S. PATENT DOCUMENTS

| | | | | | |
|---|---|---|---|---|---|
| 5,394,557 A | * | 2/1995 | Ellis | ........................ | G06F 1/10 327/40 |
| 5,835,998 A | * | 11/1998 | Pedersen | .......... | H03K 19/17728 326/40 |
| 5,912,572 A | * | 6/1999 | Graf, III | .................. | H03L 7/00 327/144 |
| 5,917,350 A | * | 6/1999 | Graf, III | .................. | H03L 7/00 327/141 |
| 5,920,213 A | * | 7/1999 | Graf, III | .................. | G06F 1/04 327/141 |
| 5,929,676 A | * | 7/1999 | Graf, III | .................. | G06F 1/04 327/144 |
| 6,084,447 A | * | 7/2000 | Graf, III | .................. | H04L 7/02 327/144 |

(Continued)

OTHER PUBLICATIONS

Galloway et al., U.S. Appl. No. 14/075,802, filed Nov. 8, 2013.

(Continued)

*Primary Examiner* — Crystal L Hammond
(74) *Attorney, Agent, or Firm* — Treys Law Group, P.C.; Vineet Dixit

(57) ABSTRACT

Integrated circuits such as programmable integrated circuits may include programmable logic regions that can be configured to perform custom user functions. The programmable logic regions include register circuitry that may be controlled by register control signals. A clock enable feedback loop circuit controlled by a clock enable control signal may couple the register output to the register input. The clock enable feedback loop circuit may facilitate adjustment of register locations within a design while ensuring correct clock enable functionality. A group of programmable logic regions may have shared input selection circuitry that selects register control signals and produces delayed versions of the signals that are shared by the group. If desired, each programmable logic region may be provided with adjustable delay circuitry that individually adjusts control signal delay for registers of that programmable logic region.

26 Claims, 13 Drawing Sheets

(56) References Cited

U.S. PATENT DOCUMENTS

| | | | | |
|---|---|---|---|---|
| 6,154,417 A * | 11/2000 | Kim | ............... | G11C 7/1039 365/189.04 |
| 6,292,015 B1 * | 9/2001 | Ooishi | ............... | H03K 19/0016 326/101 |
| 7,036,106 B1 * | 4/2006 | Wang | ............... | G06F 9/30145 703/15 |
| 7,276,934 B1 * | 10/2007 | Young | ............... | H03K 19/17736 326/38 |
| 7,353,487 B1 * | 4/2008 | Bergendahl | ............... | G06F 17/5054 326/38 |
| 7,420,390 B1 * | 9/2008 | Hutton | ............... | H03K 19/17728 326/38 |
| 7,579,866 B1 * | 8/2009 | Hutton | ............... | H03K 19/17748 326/101 |
| 7,656,191 B2 * | 2/2010 | Lewis | ............... | G11C 7/1045 326/40 |
| 2002/0057103 A1 * | 5/2002 | Ngai | ............... | G06F 7/506 326/39 |
| 2009/0044038 A1 * | 2/2009 | Lee | ............... | G06F 1/08 713/501 |

OTHER PUBLICATIONS

Vanderhoek et al. U.S. Appl. No. 13/630,925, filed Sep. 28, 2012.
C.E. Leiserson and J.B. Saxe, "Retiming Synchronous Circuitry", Digital Systems Research Center, Palo Alto, California, Aug. 20, 1986.
N.Weaver and J.Wawarzynek, "The Effects of Datapath Placement and C-Slow Retiming on Three Computational Benchmarks", FPGA 2003.
N.Weaver, Y.Markovskiy, Y.Patel, and J.Wawryznek, "Post-Placement C-Slow retiming for the Xilinx Virtex FPGA", FPGA 2003.

\* cited by examiner

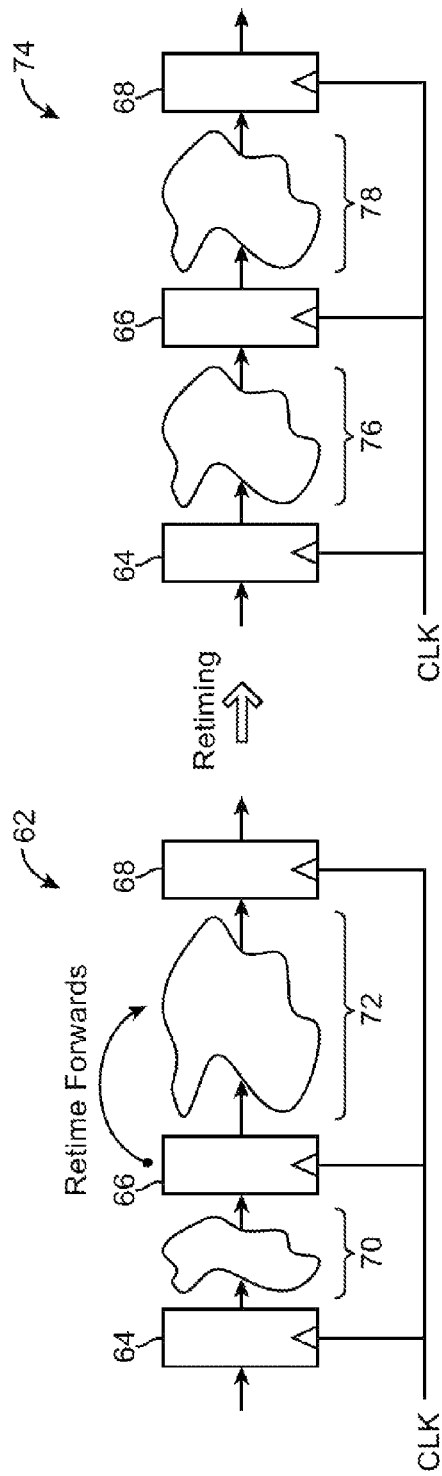
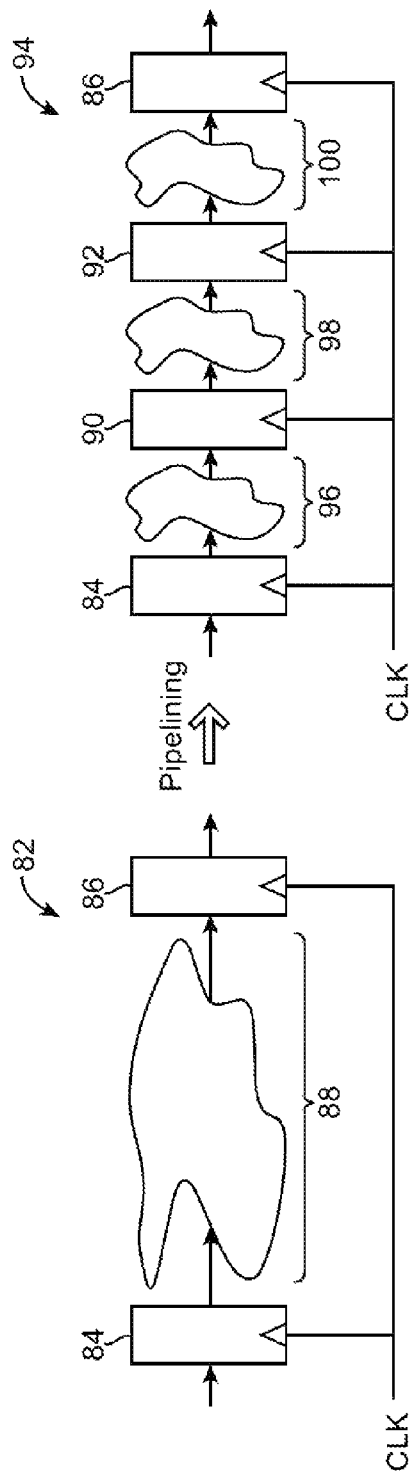
FIG. 4
FIG. 5

INTEGRATED CIRCUITS WITH IMPROVED REGISTER CIRCUITRY

BACKGROUND

This relates to integrated circuits such as programmable integrated circuits with register circuitry.

Programmable integrated circuits are well known. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

The computer-aided design tools may be used in optimizing user designs for improved performance. For example, retiming, pipelining, and multithreading optimizations may be used to modify the register locations in a user design for increased clock speeds. However, such optimizations can be challenging to implement. Modification of register placement in user designs can lead to misaligned control or data signals and may lead to incorrect register operations such as clock enable operations.

SUMMARY

An integrated circuit such as a programmable integrated circuit may include register circuitry. A programmable integrated circuit may include programmable logic regions and interconnects that couple the logic regions. Each logic region may include look-up table circuitry that may be configured to perform desired user functions. The look-up table circuitry may be coupled to at least one register. The register may be controlled by register control signals such as a synchronous load signal, a synchronous clear signal, an asynchronous clear signal, and a clock enable signal. A clock enable feedback loop circuit controlled by the clock enable signal may couple the register output to the register input. The clock enable feedback loop circuit may facilitate adjustment of register locations within a design while ensuring correct clock enable functionality.

Programmable logic regions may be organized in groups that share input selection circuitry for selecting programmable logic input signals from interconnects and share output selection circuitry for routing programmable logic output signals to the interconnects. The input selection circuitry of a programmable logic region group may select register control signals for the registers of the programmable logic regions of the group. The input selection circuitry may include delay circuits that produce delayed versions of the selected register control signals. The selected register control signals and the delayed versions may be provided to each of the programmable logic regions over shared paths and each programmable logic region may be configured to select appropriate control signals from the shared paths. If desired, adjustable delay circuitry may be provided at each of the programmable logic regions to provide flexibility in selecting appropriate delays for control and/or data signals at each programmable logic region. Programmable logic regions with delay circuitry (e.g., shared by a group or per-logic region) may help facilitate adjustment of register locations in a custom logic design.

Further features of the invention, its nature and various advantages will be more apparent from the accompanying drawings and the following detailed description of the preferred embodiments.

BRIEF DESCRIPTION OF THE DRAWINGS

FIG. 4 is an illustrative diagram showing how the location of registers in a logic design may be adjusted for retiming in accordance with an embodiment of the present invention.

FIG. 5 is an illustrative diagram showing how the location of registers in a logic design may be adjusted for pipelining in accordance with an embodiment of the present invention.

DETAILED DESCRIPTION

The present invention relates to integrated circuits including register circuitry. Examples are described herein in the context of programmable integrated circuits that may include programmable logic, programmable interconnects, and programmable routing circuitry.

Figure 1:
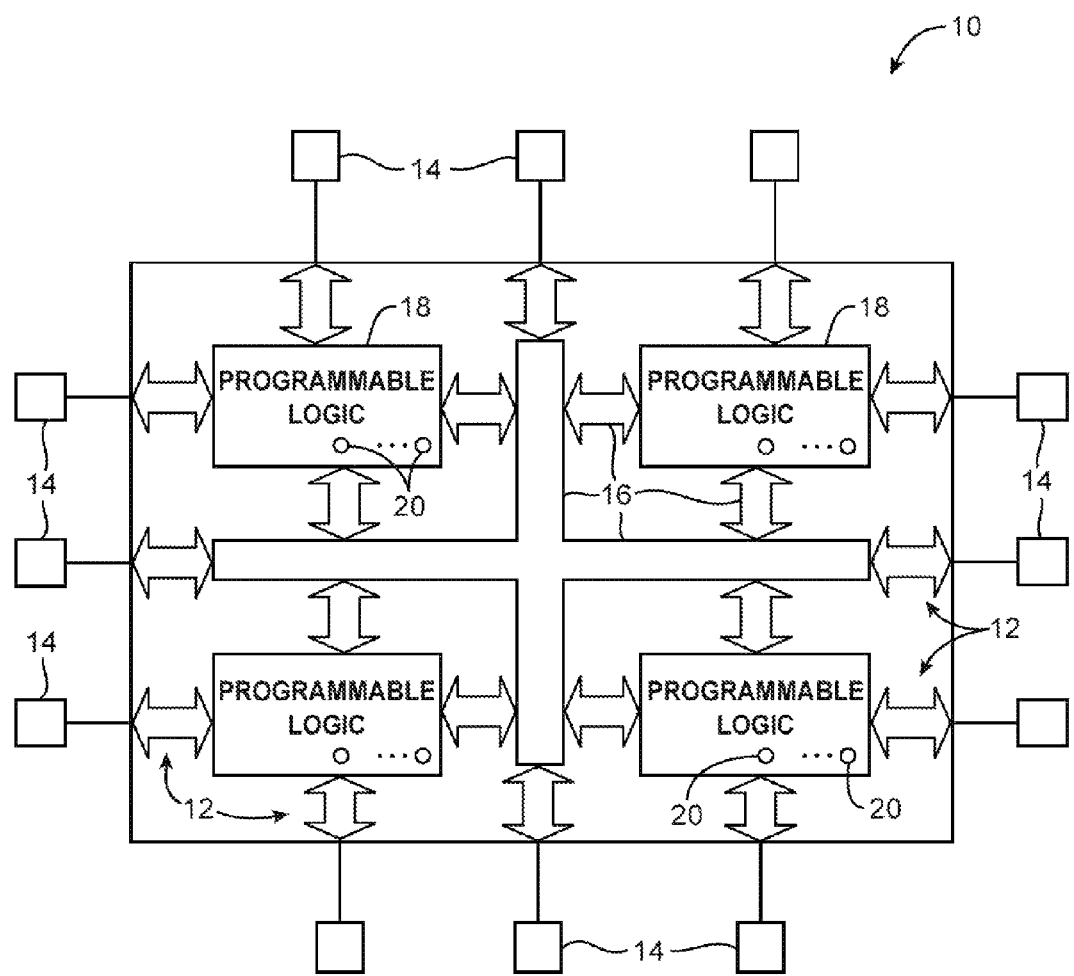
FIG. 1 is an illustrative diagram of a programmable integrated circuit with programmable logic in accordance with an embodiment of the present invention.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform one or more custom logic functions.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
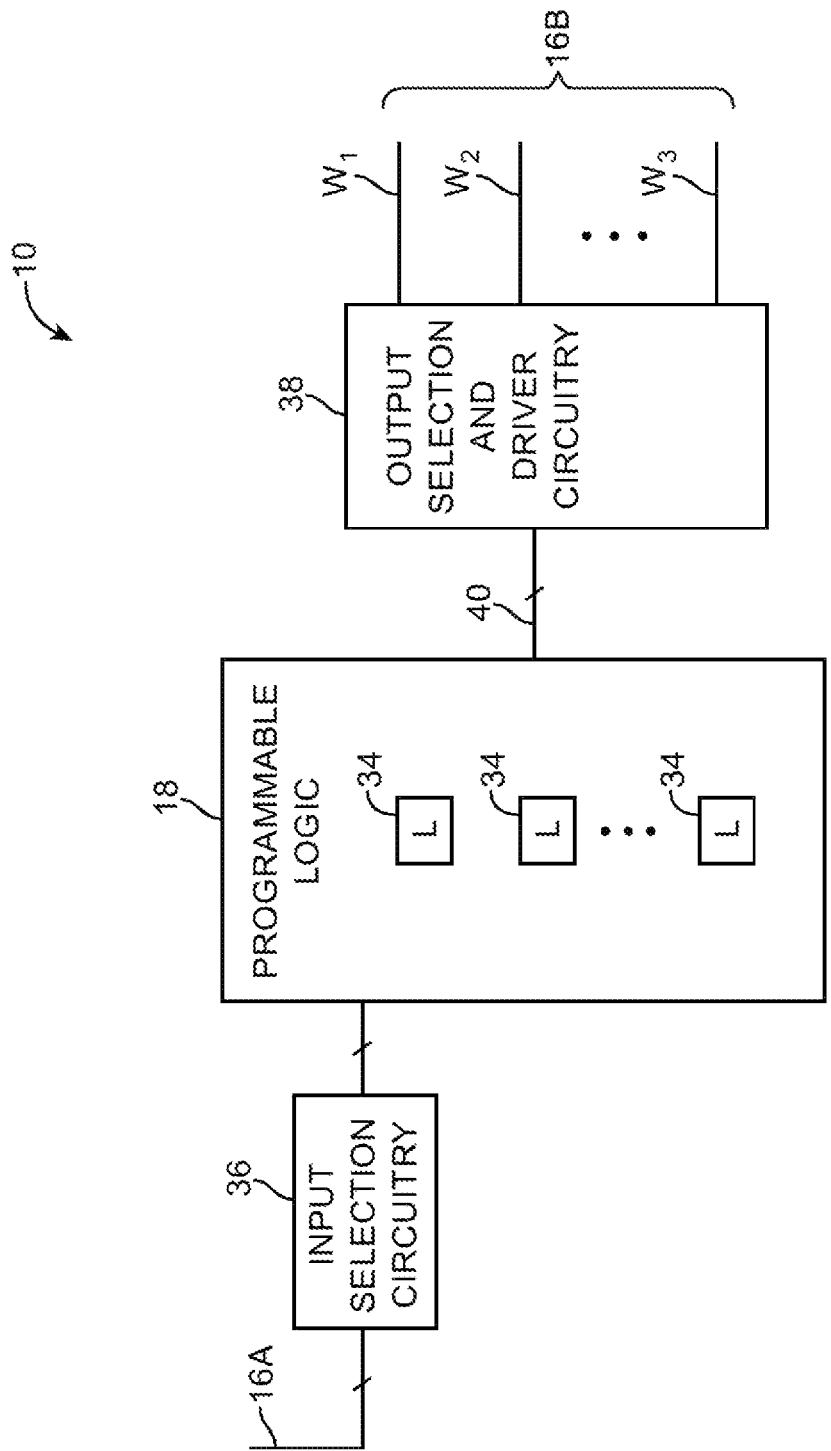
FIG. 2 is an illustrative diagram of a group of programmable logic with input selection and output selection circuitry in accordance with an embodiment of the present invention.

An illustrative programmable logic region 18 including a group of multiple smaller logic regions 34 is shown in FIG. 2. Programmable logic region 18 (sometimes referred to as a logic array block) may have associated input selection circuitry 36 and output selection and driver circuitry 38. Input selection circuitry 36 and output selection and driver circuitry 38 may be formed as part of input-output circuits such as input-output circuits 21 of FIG. 1. Input selection circuitry 36 may receive input signals via interconnects 16A. For example, interconnects 16A may provide input signals to programmable logic region 18 from other programmable logic regions 18 or from input/output pins 14. Input selection circuitry 36 may be configured (e.g., by programming CRAM bits that are associated with input selection circuitry 36) to select one or more of the input signals to provide to programmable logic region 18.

Programmable logic region 18 may include smaller regions of programmable logic 34. The smaller programmable logic regions 34 within each programmable logic region 18 may sometimes be referred to as adaptive logic modules (ALMs) or logic elements (LEs). Logic regions 34 may receive the input signals that are selected by input selection circuitry 36 and may perform custom functions on the input signals to produce output signals. The input signals received by each logic region 34 may overlap with input signal portions received by other logic regions 34 (e.g., some of the input signals received by a first logic region 34 may also be received by a second logic region 34). The output signals may be provided to output selection and driver circuitry 38 via output paths 40. The number of logic regions 34 is merely illustrative. If desired, programmable logic region 18 may be formed with any number of logic regions 34 that perform custom functions on input signals that are selected by input selection circuitry 36.

Output selection and driver circuitry 38 may receive output signals via paths 40 and may be configured to provide the output signals to interconnects 16B. If desired, output selection circuitry 38 may be configured to disconnect one or more of interconnects 16B (e.g., by providing no output signal or by providing a high impedance output).

If desired, output selection circuitry 38 may be configured to provide a given output signal to multiple interconnects 16B. For example, it may be desirable to route an output signal from a given logic region 34 to two different regions of integrated circuit 10. In this scenario, output selection and driver circuitry 38 may provide that output signal to two different interconnects of different lengths.

Figure 3:
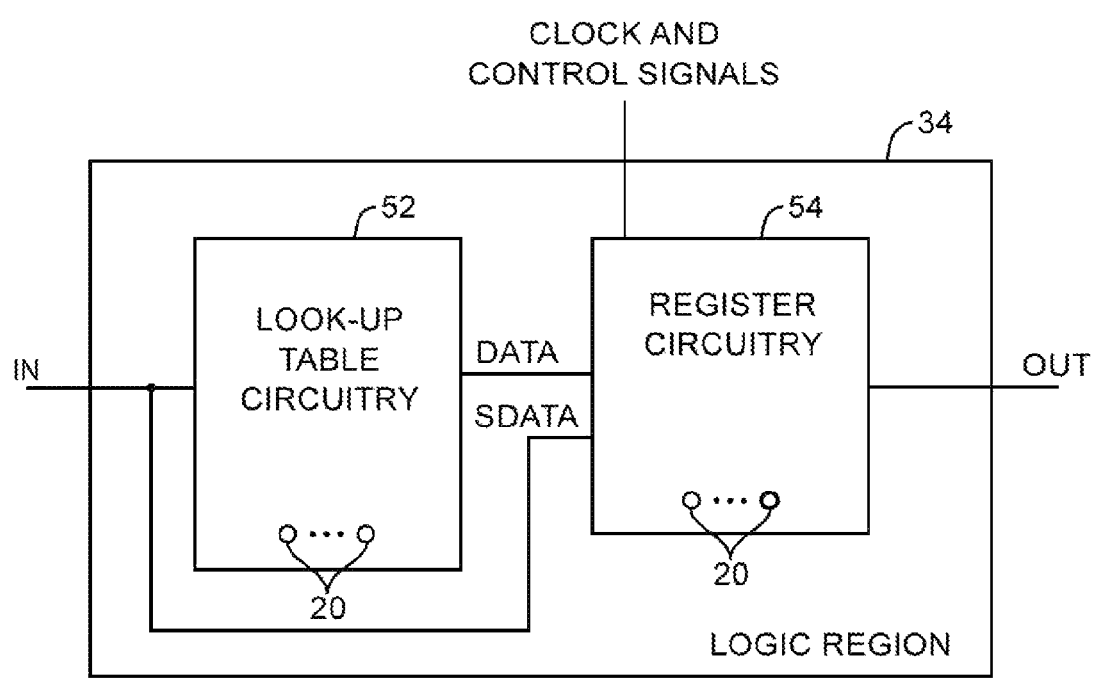
FIG. 3 is an illustrative diagram of programmable logic with register circuitry in accordance with an embodiment of the present invention.

FIG. 3 is an illustrative example of a logic region 34. As shown in FIG. 3, logic region 34 may include look-up table circuitry 52 and register circuitry 54. Look-up table circuitry 52 may include look-up tables that process any desired number of inputs. For example, circuitry 52 may include a 4-input look-up table (4-LUT), 5-input look-up table (5-LUT), 8-input look-up table (8-LUT), etc. If desired, look-up table circuitry 52 may have multiple configurations each providing a different number of inputs and/or outputs. For example, look-up table circuitry 52 may be a fracturable look-up table having eight inputs. In this scenario, circuitry 52 may have a first configuration in which circuitry 52 forms a 6-LUT with one output and a second configuration in which circuitry 52 forms two 4-LUTs with two respective outputs. The configuration of circuitry 52 and the logic functions implemented by the look-up tables may be determined based on configuration values stored in programmable elements 20.

Input signals IN may be received by look-up table circuitry 52 (e.g., from input selection circuitry 36 of FIG. 2)

and processed based on the configuration of look-up table circuitry 52. If desired, one or more input signals IN may be provided directly to register circuitry 54 as signals SDATA. Output signals DATA produced by look-up table circuitry may be stored by register circuitry 54 and produced as output signals OUT of logic region 34. If desired, registers in register circuitry 54 may be bypassed using direct paths from look-up table circuitry 52.

Register circuitry 54 may include one or more registers that store output signals from look-up table circuitry 52 based on one or more clock and control signals. The clock and control signals may be received from interconnects such as interconnects 16 of FIG. 1. If desired, the clock signals may be received from dedicated clock paths (e.g., a global clock tree). Input selection circuitry 36 may be used to select which clock and control signals are provided to register circuitry 54.

The frequency at which clock signals operate may be constrained by delay associated with circuitry between registers. For example, the maximum clock frequency at which an integrated circuit can operate may be constrained by the path with maximum delay (sometimes referred to as the critical path of the circuit). Custom user logic implemented using programmable circuitry may utilize registers in any desired programmable regions. The delay between any two registers may include interconnect path delay (e.g., associated with interconnects 16) and combinational logic delay (e.g., associated with look-up table circuitry 52).

Optimizing placement and use of registers in an integrated circuit design may help reduce delay between registers, thereby increasing the maximum operating speed of the integrated circuit. FIG. 4 is an illustrative diagram showing how register placement may be optimized in an integrated circuit design. As shown in FIG. 4, an initial design 62 may include registers 64, 66, and 68. For example, registers 64, 66, and 68 may be from first, second, and third programmable logic regions 18, respectively. The output of register 64 may be coupled to an input of register 66 by intervening circuitry 70, whereas registers 66 and 68 may be coupled by intervening circuitry 72. Circuitry 70 and 72 may include interconnects and combinational logic (e.g., look-up tables) that introduce delay in signals between the registers. The delay associated with circuitry 70 may be greater than the delay associated with circuitry 72. In this scenario, the maximum operating frequency may be determined by the delay associated with circuitry 72.

The maximum operating frequency of circuit design 62 may be improved by adjusting the location of intermediate register 66 to balance delay between the registers. Such register adjustments may sometimes be referred to as retiming operations and may be performed by circuit design tools such as computer-aided design (CAD) tools that are implemented on computing equipment. If desired, retiming operations may be performed manually by a user with the computer-aided design tools.

Retiming operations may adjust the location of register 66 to help equalize the delay between consecutive registers. For example, the location of register 66 may be moved so that circuitry 70 and a first portion of circuitry 72 form circuitry 76, whereas a second portion of circuitry 72 forms circuitry 78 (e.g., a previously bypassed register within circuitry 72 may be enabled to serve as register 66 and the originally used register may be bypassed). In this scenario, the delay of circuitry 76 may be similar (e.g., equal) to the delay of circuitry 78, which is less than the delay of circuitry 72 and therefore the maximum operating frequency may be increased.

If desired, pipelining operations may be performed by adding registers to a design. As shown in FIG. 5, an initial design 82 may include registers 84 and 86 that are separated by intervening circuitry 88. To help increase the operating speed of clock CLK, additional registers 90 and 92 may be interposed between registers 84 and 86 to form pipelined design 94. Additional registers 90 and 92 may partition circuitry 88 into portions 96, 98, and 100 that each have less delay than circuitry 88, which allows clock CLK to operate at an increased clock speed relative to design 82.

Figure 6:
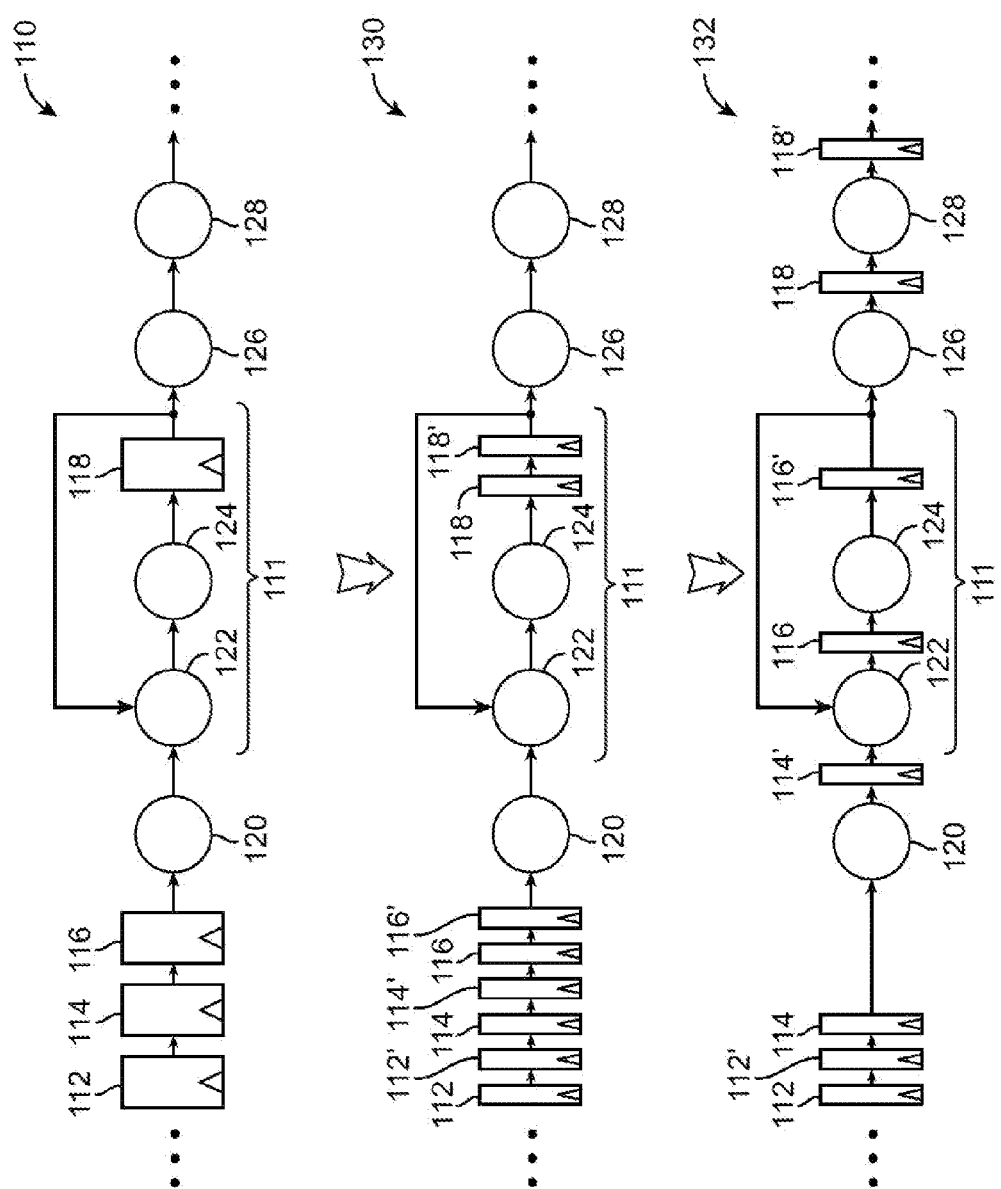
FIG. 6 is an illustrative diagram showing how the location and number of registers in a logic design may be adjusted for multithreading and retiming in accordance with an embodiment of the present invention.

In some scenarios, register circuitry may be time-shared to allow a processing path to perform multiple processing operations simultaneously (sometimes referred to as multi-threading). FIG. 6 is an illustrative diagram showing how an initial circuit design 110 including a processing loop 111 may be modified to perform time-sharing between multiple data streams.

As shown in FIG. 6, initial circuit design 110 may include registers 112, 114, 116, and 118 and logic circuitry 120, 122, 124, 126, and 128. Circuitry 122 and 124 and register 118 may form a processing loop 111 in which the output of loop 111 also serves as an input of the processing loop (e.g., the output of register 118 serves as an input of circuitry 126 and 122).

Initial design 110 may be modified to implement multi-threading by adding a duplicate copy of each register, thereby doubling the number of registers in the design. Multithreaded design 130 shows duplicate copies 112', 114', 116', and 118' of registers 112, 114, 116, and 118, respectively. Consider the scenario in which circuitry 120, 122, 124, 126, and 128 performs a logical function on signals stored in the registers. In this scenario, an input signal provided to register 112 may be time-shared between two different data streams. The input signal may be toggled between the two different data streams at each clock period such that at any given clock period, a first data stream is stored in registers 112, 114, 116, and 118 whereas a second data stream is stored in registers 112', 114', 116', and 118'. Use of duplicate registers allows circuitry 120, 122, 125, 126, and 128 to process the first and second data streams during alternating clock cycles.

If desired, multithreaded design 130 may be further optimized to improve performance by balancing delay between registers (e.g., similar to FIG. 4). The registers of multithreaded design 130 may be moved to balance delay associated with circuitry 120, 122, 124, 126, and 128 to form retimed design 132.

Figure 7:
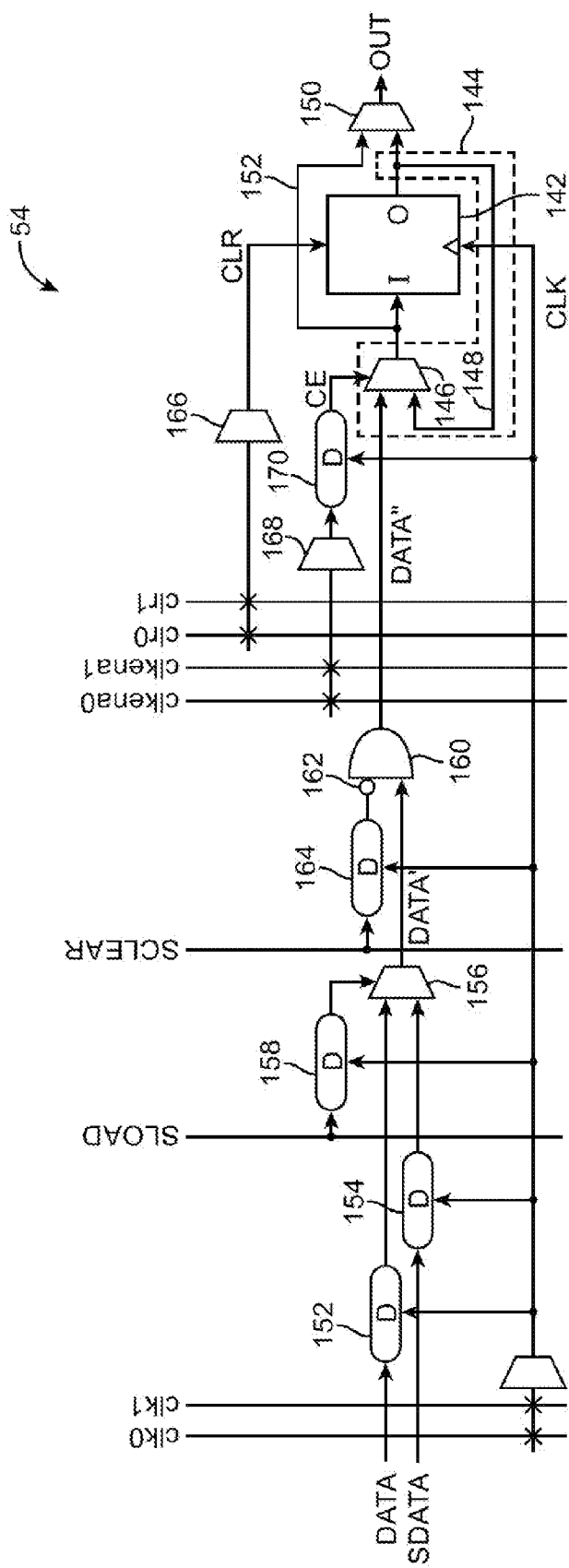
FIG. 7 is an illustrative diagram of register circuitry including a clock enable feedback loop circuit and adjustable delay circuits in accordance with an embodiment of the present invention.

To help facilitate optimization of integrated circuit designs via register adjustments, logic regions such as logic regions 34 of FIG. 3 may be provided with register circuitry 54 as shown in FIG. 7. Register circuitry 54 includes register 142 that stores input data received at input I to produce output data at output O based on clear signal CLR and clock signal CLK. Register 142 may be implemented using a flip-flop circuit such as a latch, pulse latch, or master-slave latch. Circuitry 54 may control register 142 to store data DATA or SDATA based on control signals such as SLOAD, SCLEAR, CLKENA0, CLKENA1, CLR0, and CLR1.

Register adjustments can sometimes lead to timing mismatch between data paths. For example, a first data path through a first set of programmable logic regions and a second data path through a second set of programmable logic regions may converge for processing (e.g., each path may serve as a respective input of a logic function). In this scenario, adjustments such as the addition or removal of registers in only one of the data paths can lead to imbalanced timing between the first and second data paths. Register circuitry 54 may be provided with adjustable delay circuitry that may help to compensate for delay mismatch. Addition of one or more registers in the first path may be compensated by adding delay with the adjustable delay circuitry in one or more register circuitry 54 in the second path. Conversely, removal of registers in the first path may be compensated by reducing delay at the adjustable delay circuitry in the second path.

Register circuitry 54 may receive input data signals DATA and SDATA. For example, signal DATA may be received from look-up table circuitry 52 of FIG. 3, whereas signal SDATA may be received directly from input selection circuitry 36 of FIG. 2. Adjustable delay circuits 152 and 154 may provide delayed versions of signals DATA and SDATA to input multiplexer 156. Adjustable delay circuit 158 may provide a delayed version of control signal SLOAD to input multiplexer 156. Input multiplexer 156 may select data signal DATA' from the delayed version of signals DATA and SDATA based on control signal SLOAD.

Input multiplexer 156 may provide data signal DATA' to AND gate 160. Adjustable delay circuit 164 may provide a delayed version of control signal SCLEAR to an inverted input of AND gate 160 (e.g., an inverter 162 that inverts the delayed version of control signal SCLEAR). AND gate 160 may serve as synchronous clear circuitry that selectively clears data signal DATA' based on control signal SCLEAR. For example, when control signal SCLEAR is logic zero, the inverted input to AND gate 162 is logic one and gate 162 passes input signal DATA' as output signal DATA". As another example, when control signal SCLEAR is logic one, the inverted input to AND gate 162 is logic zero and gate 162 passes a logic zero as output signal DATA" regardless of the value of input signal DATA'.

Register 142 may include an asynchronous clear input that is provided with asynchronous clear signal CLR via multiplexer 166. Multiplexer 166 may be configured to select asynchronous clear signal CLR from a set of available clear signals such as CLR0 and CLR1.

The example of FIG. 7 in which AND gate 160 serves as synchronous clear circuitry is merely illustrative. If desired, any desired logic circuitry that clears the input signal to register 144 may replace AND gate 160. For example, the asynchronous clear circuitry may include one or more logic gates, a multiplexer, or other combinational logic. If desired, signal SDATA and mux 156 may be omitted so that signal DATA is passed to AND gate 160 instead of signal DATA'. If desired, synchronous and/or asynchronous clear signals may be omitted.

Multiplexers of register circuitry 54 may be coupled to programmable elements storing configuration values that configure the multiplexers to select output signals from input signals (e.g., programmable elements 20 of register circuitry 54 as shown in FIG. 3). Similarly, adjustable delay circuitry may be coupled to programmable elements that configure the adjustable delay circuitry for a desired amount of delay.

Register 142 may be provided with clock enable circuitry 144 including clock enable multiplexer 146 and feedback path 148. Clock enable multiplexer 146 receives data signal DATA" and also the output data signal from register 142 and selects between the two signals based on clock enable signal CE. The selected data signal is provided to input I of register 142. Clock enable signal CE may be selected from a set of clock enable signals (e.g., CLKENA0 and CLKENA1) by multiplexer 168. Adjustable delay circuit 170 may be configured to adjust the timing of clock enable signal CE.

Clock enable circuitry 144 may help facilitate retiming optimizations involving register 142 that is controlled by a clock enable signal. Consider the scenario in which register 142 is configured to serve as register 66 of initial design 62 of FIG. 4. In this scenario, register 142 may be bypassed during retiming operations (e.g., to move portions of circuitry 72 that are located subsequent to register 142 to circuitry 70 that is located prior to register 142). Register 142 may be bypassed by configuring multiplexer 150 to select bypass path 152 to route the input signal of register 142 as output signal OUT. When register 142 is bypassed via path 152, clock enable circuitry 144 may help to ensure that clock enable functions are correctly performed. For example, in response to clock enable signal CE indicating that clock input should be disabled, clock enable multiplexer 146 may select and route the output of register 142 to the input of register 142. By selecting feedback path 148, clock enable multiplexer 146 disables the clock input, because the register no longer stores new data. Register circuitry 54 therefore maintains correct clock enable functionality even when register 142 is bypassed via path 152 for retiming.

Each programmable logic region (e.g., each smaller region 34 of each logic region 18 of FIG. 2) may be provided with register circuitry 54 that accommodates adjustment of register locations in a custom user design. For example, retiming, pipelining, multithreading, or other register optimizations may be performed on custom user designs that are implemented using the programmable logic regions, because the register circuitry of each logic region may be selectively bypassed or used, the clock enable circuitry provides correct clock enable functionality, and adjustable delay circuitry on data and control signal paths accommodate potential mismatch associated with register adjustments.

The example of FIG. 7 in which adjustable delay circuitry 164 is provided for each register circuitry 54 provides improved flexibility in accommodating different custom user designs, because each register circuitry 54 can be adjusted individually. If desired, shared control signals may be provided to a group of register circuitry. The shared control signals may include delayed versions of the control signals so that it is not necessary to include adjustable delay circuitry 164 for each register circuitry (e.g., providing reduced circuit area).

Figure 8:
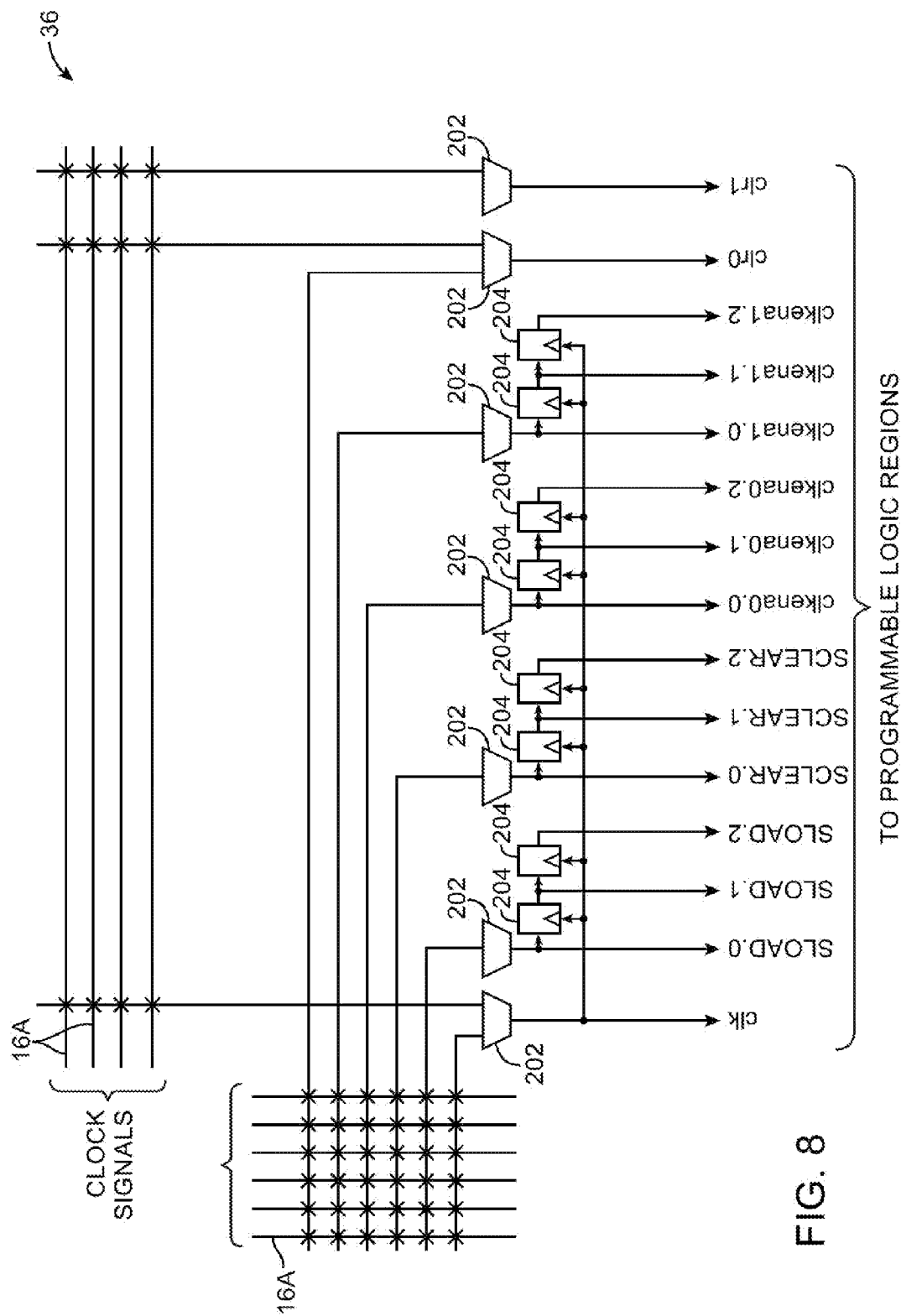
FIG. 8 is an illustrative diagram of input selection circuitry including delay circuits for producing delayed versions of control signals that may be shared by registers of a group of logic regions in accordance with an embodiment of the present invention.

FIG. 8 is a diagram of a portion of input selection circuitry 36 including shared control signals for a set of programmable logic regions. For example, the control signals may be shared by logic regions 34 of logic region 18 of FIG. 2. In the example of FIG. 8, input data selection circuitry of circuitry 36 has been omitted for clarity.

As shown in FIG. 8, interconnects 16A may convey clock signals and control signals such as synchronous load signals (e.g., SLOAD.0, SLOAD.1, and SLOAD.2), synchronous clear signals (e.g., SCLEAR.0, SCLEAR.1, and SCLEAR.2), clock enable signals (e.g., CLKENA0.0, CLKENA0.1, and CLKENA0.2), asynchronous clear signals (e.g., CLR0, CLR1). Multiplexers 202 may receive and select the clock and control signals from interconnects 16A.

Delay circuitry may be provided that produces delayed versions of each control signal (or only some of the control signals). In the example of FIG. 8, a register chain is provided for each control signal that produces delayed versions of that control signal. Each register chain may include registers 204 that are clocked by selected clock signal CLK. Consecutive registers in a register chain produce delayed clock signals that are delayed by one clock cycle. For example, clock enable signal CLKENA1.0 that is selected by a multiplexer 202 is delayed by one clock cycle to produce clock enable signal CLKENA1.1, whereas clock enable signal CLKENA1.1 is delayed by one clock signal to produce clock enable signal CLKENA1.2.

Figure 9:
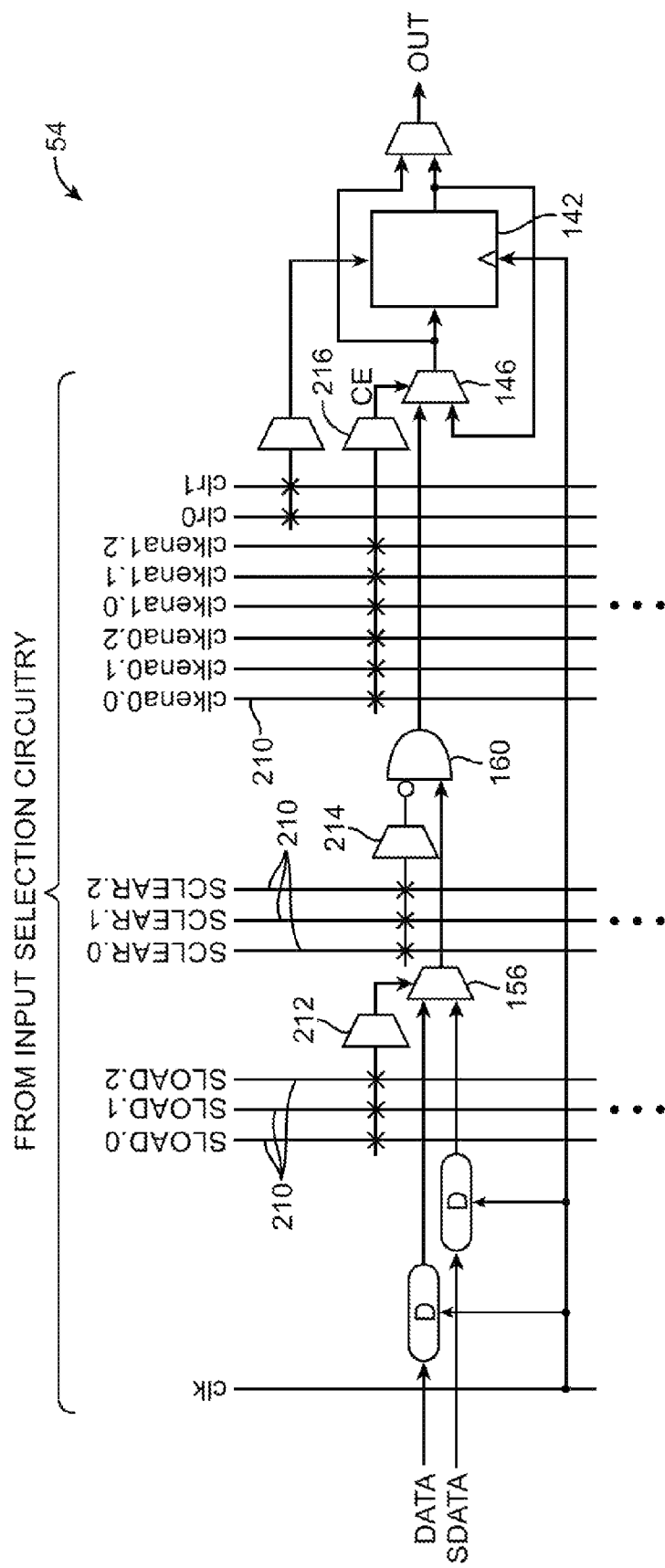
FIG. 9 is an illustrative diagram of register circuitry that selects from shared control signals in accordance with an embodiment of the present invention.

In the arrangement of FIG. 8, the control signals and delayed control signals may be provided to each of a group of programmable logic regions. For example, the shared control signals may be provided to the register circuitry of each programmable logic region 34 of a programmable logic region 18 that is coupled to input selection circuitry 36. FIG. 9 is a diagram of register circuitry 54 that may use shared control signals such as provided by the input selection circuitry 36 of FIG. 8.

As shown in FIG. 9, the shared control signals may be provided to register circuitry 54 from input selection circuitry via paths 210. Paths 210 may, for example, extend through programmable logic region 18 and interconnect each of programmable logic regions 34 of FIG. 2. Control signals for register circuitry 54 may be selected from the shared sets of control signals using multiplexers 212, 214, and 216. Multiplexer 212 may select a synchronous load signal from a set of synchronous load signals each having different amounts of delay (e.g., SLOAD.0, SLOAD1, and SLOAD2). Similarly, multiplexer 214 may select a synchronous clear signal from a set of synchronous clear signals and multiplexer 216 may select a clock enable signal from a set of clock enable signals. Use of multiplexers to select from shared control signals may help reduce the size and complexity of register circuitry 54 at each programmable logic region.

Figure 10:
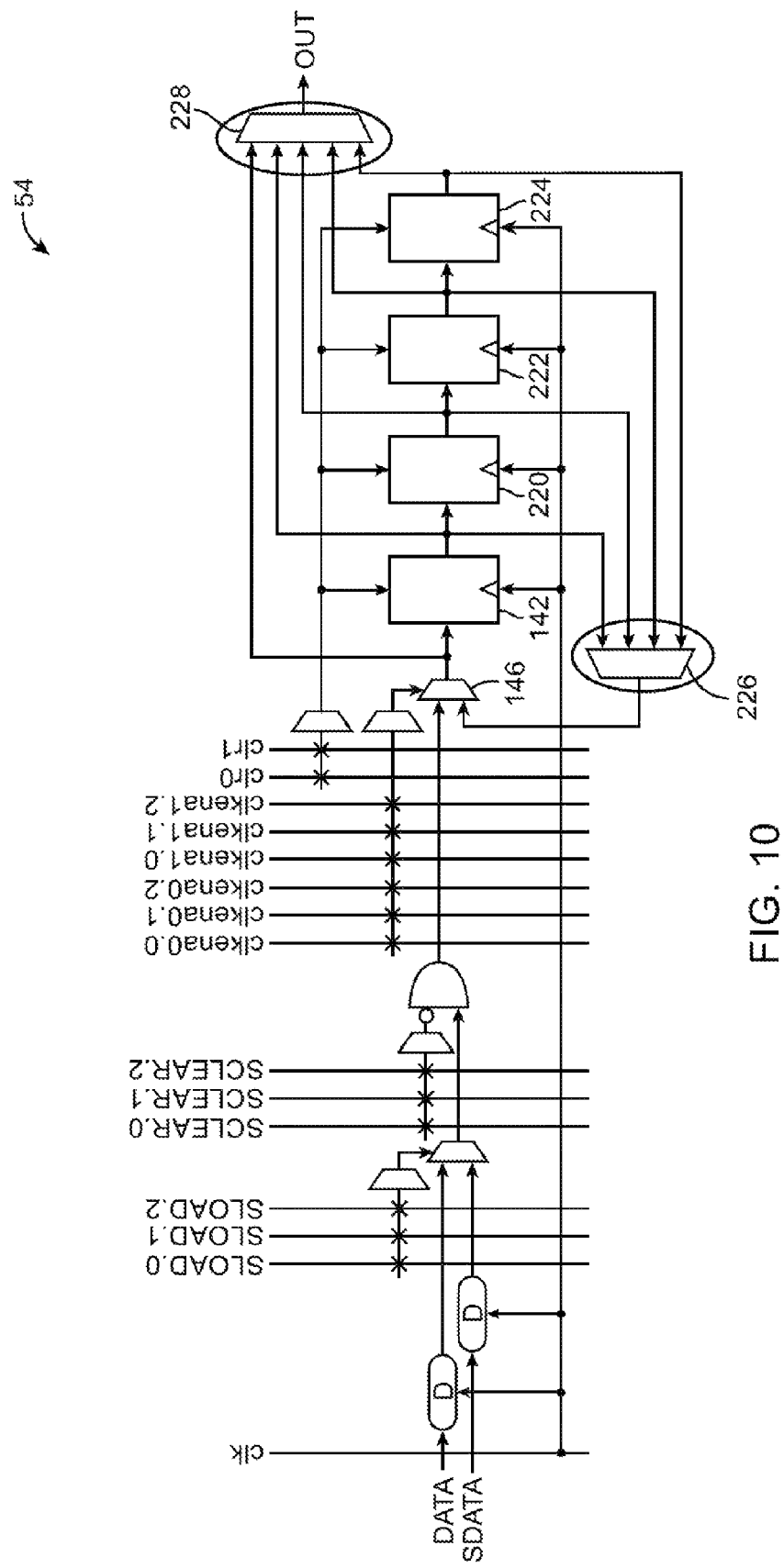
FIG. 10 is an illustrative diagram of register circuitry having programmable multithreading capabilities in accordance with an embodiment of the present invention.

Register circuitry 54 may be provided with additional registers and circuitry for handling multithreading optimizations in a custom user design. FIG. 10 is a diagram of illustrative register circuitry 54 including additional series-connected registers 220, 222, and 224 and multithreading multiplexers 226 and 228. In the example of FIG. 10, register circuitry 54 is provided with registers 220, 222, and 224 in addition to register 142 for a total of four registers that are coupled in series. In this scenario, register circuitry 54 may accommodate up to four simultaneous threads, with each register storing data for a different thread at any given clock cycle. In general, any number of additional registers may be provided for a desired number of threads.

The number of desired threads may be programmed by configuring thread selection multiplexers 226 and 228. Multiplexer 226 may determine how many registers are in the clock enable feedback loop, whereas multiplexer 228 may determine how many registers are active in a forward data path. For example, multiplexers 226 and 228 may select the output of register 220 in a two-thread configuration. In this scenario, multiplexer 226 may route the output signal of register 220 to clock enable multiplexer 146 whereas multiplexer 228 may route the output signal of register 220 to other logic regions. As another example, the output of register 224 may be selected in a four-thread configuration or the output of register 142 may be selected to disable multithreading.

Forward path selection multiplexer 228 may also help accommodate retiming optimizations. Consider the scenario in which registers 142 and 220 of FIG. 10 initially serve as registers 118 and 118' of multithreaded design 130 of FIG. 6. In this scenario, the register circuitry may separate combinational logic 124 and 126. It may be desirable to optimize the design by moving registers 118 and 118' farther along the data path and moving register 116' to the location originally occupied by registers 118 and 118' (e.g., to produce retimed design 132. To modify the custom user design, multiplexers 228 and 226 may be configured to select the output of register 142 such that register 142 of FIG. 10 serves as register 116' of retimed design 132 of FIG. 6.

Figure 11:
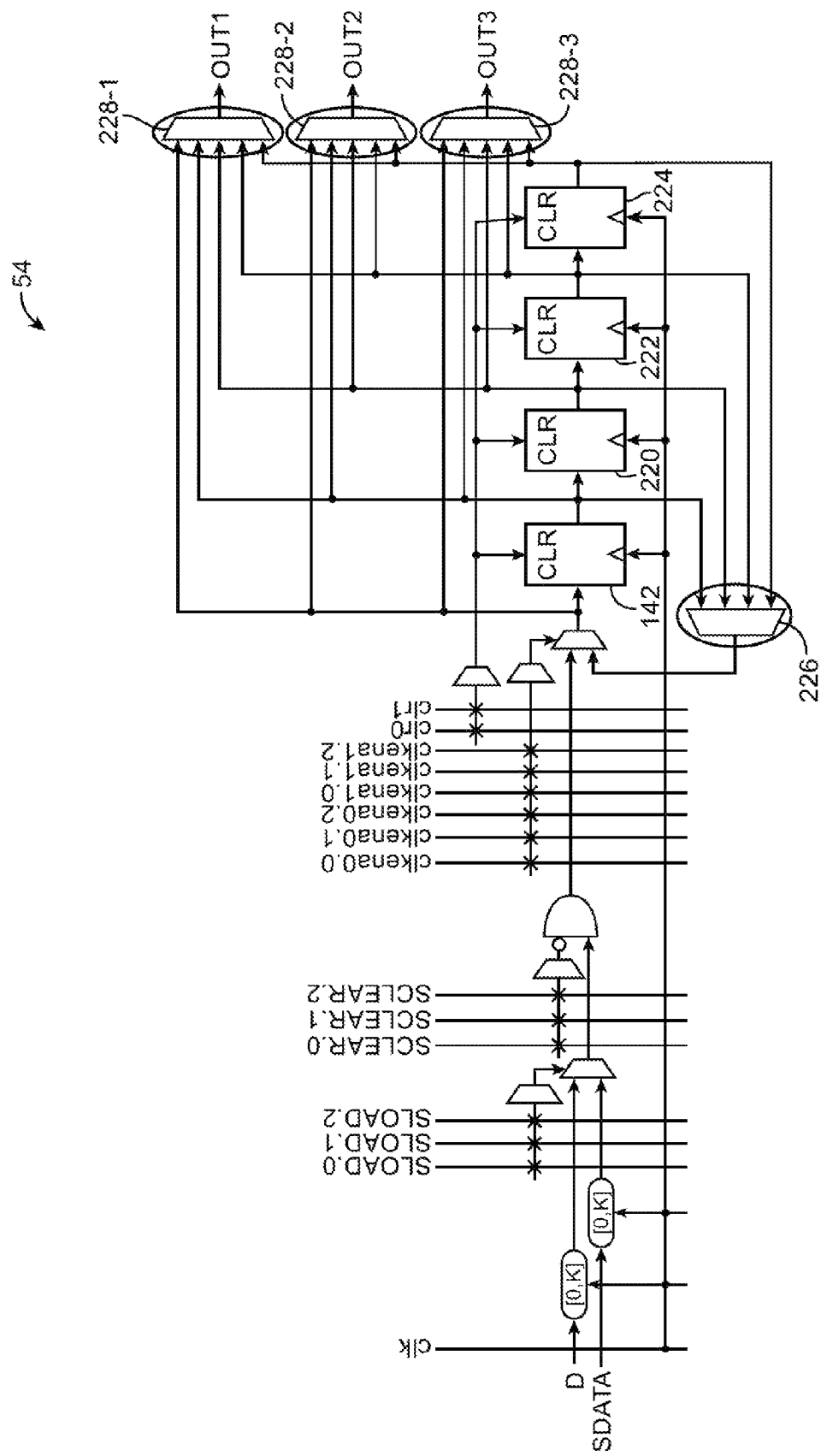
FIG. 11 is an illustrative diagram of register circuitry having programmable multithreading capabilities and multiple forward data paths in accordance with an embodiment of the present invention.

In some scenarios, additional flexibility may be desired. For example, the output of register circuitry 54 may be routed to multiple different logic regions for additional processing (e.g., register circuitry 54 of a given logic region may have a fanout greater than one). Each of the destination logic regions represents a different forward data path. In this scenario, retiming optimizations may require different register adjustments to each forward data path. FIG. 11 is a diagram of illustrative register circuitry 54 having multi-threading capabilities with additional flexibility. As shown in FIG. 11, register circuitry 54 may be provided with multiple forward path selection multiplexers (e.g., multi-plexers 228-1, 228-2, and 228-3). Each forward path selection multiplexer receives each of the register output signals and selects a respective output signal from the register output signals. For example, multiplexer 228-1 produces selected output signal OUT-1, multiplexer 228-2 produces signal OUT-2, and multiplexer 228-3 produces signal OUT-3. The output signals may be routed to other logic regions via interconnects such as interconnects 16 of FIG. 1.

By providing multiple forward path selection multiplexers that are individually configurable for different numbers of registers, register circuitry 54 may be capable of handling scenarios such as when retiming requires different numbers of registers for different data paths. In general, register circuitry 54 of a given programmable logic region may be provided with any desired number of registers and forward data path selection multiplexers. If desired, programmable logic regions on an integrated circuit may be provided with different types of register circuitry 54 for varying levels of flexibility. For example, some of the logic regions 34 of a logic region 18 of FIG. 2 may be provided with flexible multithreading register circuitry 54 of FIG. 11, whereas other logic regions 34 of the logic region 18 may be provided with multithreading register circuitry 54 of FIG. 10 and yet other logic regions 34 may be provided with clock enable feedback path circuitry 144 of FIG. 7 (e.g., without multithreading functionality).

Figure 12:
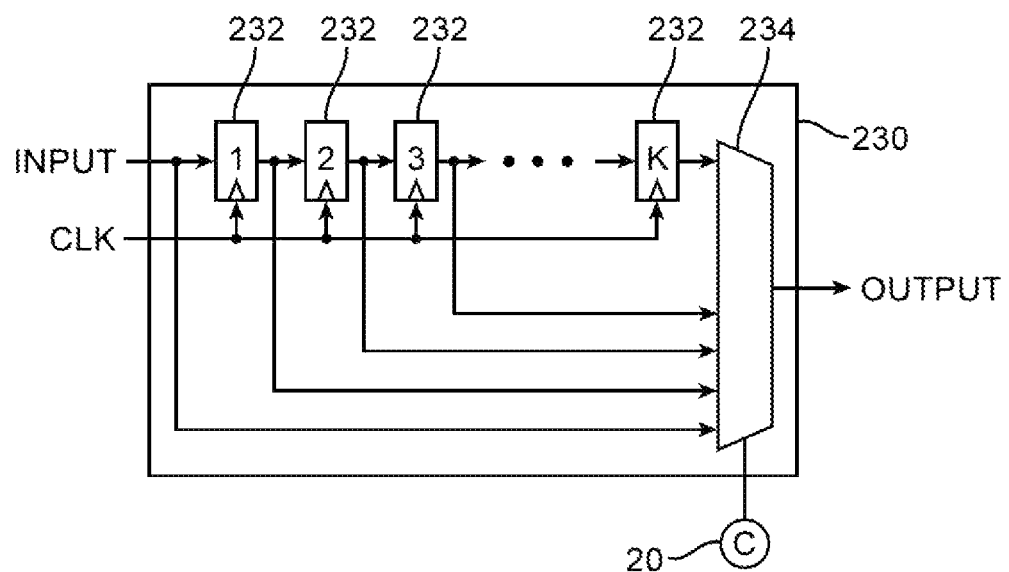
FIG. 12 is an illustrative diagram of adjustable delay circuitry that may be provided to register circuitry of a logic region in accordance with an embodiment of the present invention.

FIG. 12 is a diagram of an illustrative adjustable delay circuit 230 that may be programmed to provide a desired amount of delay for an input signal. Adjustable delay circuit 230 may, for example, be used as delay circuit 152, 154, 158, or 170 of FIG. 7. As shown in FIG. 12, delay circuit 230 may include a register chain of registers 232 (e.g., 1, 2, 3, ..., K registers). Any desired number K of registers 232 or other delay elements may be provided. Registers 232 may operate using clock signal CLK such that register chain 232 delays input signal by one to K clock cycles. The delayed versions of the input signals are received by multiplexer 234, which may be configured by one or more programmable elements 20 to select an output signal from the delayed versions.

Figure 13:
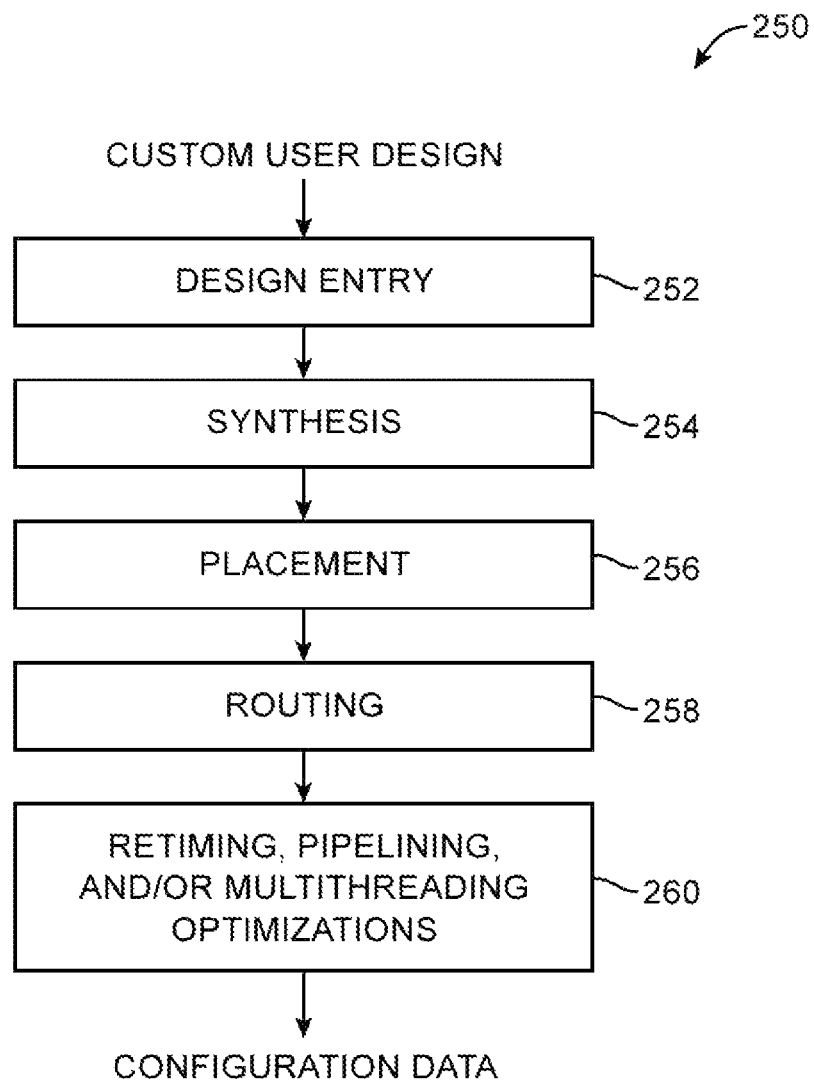
FIG. 13 is a flow chart of illustrative steps that may be performed by a logic design system in implementing a custom user design on programmable circuitry with register optimizations in accordance with an embodiment of the present invention.

FIG. 13 is a flow chart of illustrative steps that may be performed by a logic design system in performing register optimizations for a design using programmable register circuitry of programmable logic regions on a programmable integrated circuit. The logic design system may include computer-aided design tools implemented on computing equipment.

During step 252, the logic design system may receive a custom user design during design entry operations. The custom user design may include custom logic functions to be performed by the logic regions.

During step 254, the logic design system may perform synthesis operations in converting the custom user design into a synthesized netlist. During subsequent steps 256 and 258, place and route operations may be performed in mapping the synthesized netlist to the physical layout of the programmable integrated circuit. For example, during steps 254-258, the logic design system may configure look-up table circuitry of the programmable logic regions to perform custom user functions. Data paths may be formed that process data with look-up table circuitry, store data in registers of the programmable logic regions (e.g., registers of register circuitry 54 of FIG. 3), and convey the stored data to other logic regions over programmable interconnects.

During step 260, the logic design system may perform register placement optimizations using register circuitry of the programmable logic regions. For example, retiming operations may be performed to move registers in the design to balance delay between registers. A currently used register in a design may be moved by bypassing the currently used register and enabling a register at a different location (e.g., a different logic region). Adjustable delay circuitry of each affected logic region such as 152, 154, 158, 164, and 170 of FIG. 7 may be adjusted to help ensure that appropriate timing of control signals is maintained. In scenarios such as when shared delay circuitry between logic regions of a group is used, multiplexers at each logic region may be configured to select control signals with desired delay from the shared control signals. Multithreading optimizations may be enabled by configuring multithreading circuitry of each logic region such as additional registers and multiplexers (e.g., multiplexers 226 and 228 of FIG. 10).

The computer-aided design tools may load the optimized configuration data produced during step 260 onto the programmable integrated circuit. For example, programmable elements 20 may be loaded with appropriate configuration values for programming look-up table circuitry, multiplexers, adjustable delay circuits, programmable interconnects, and other programmable circuitry.

Figure 14:
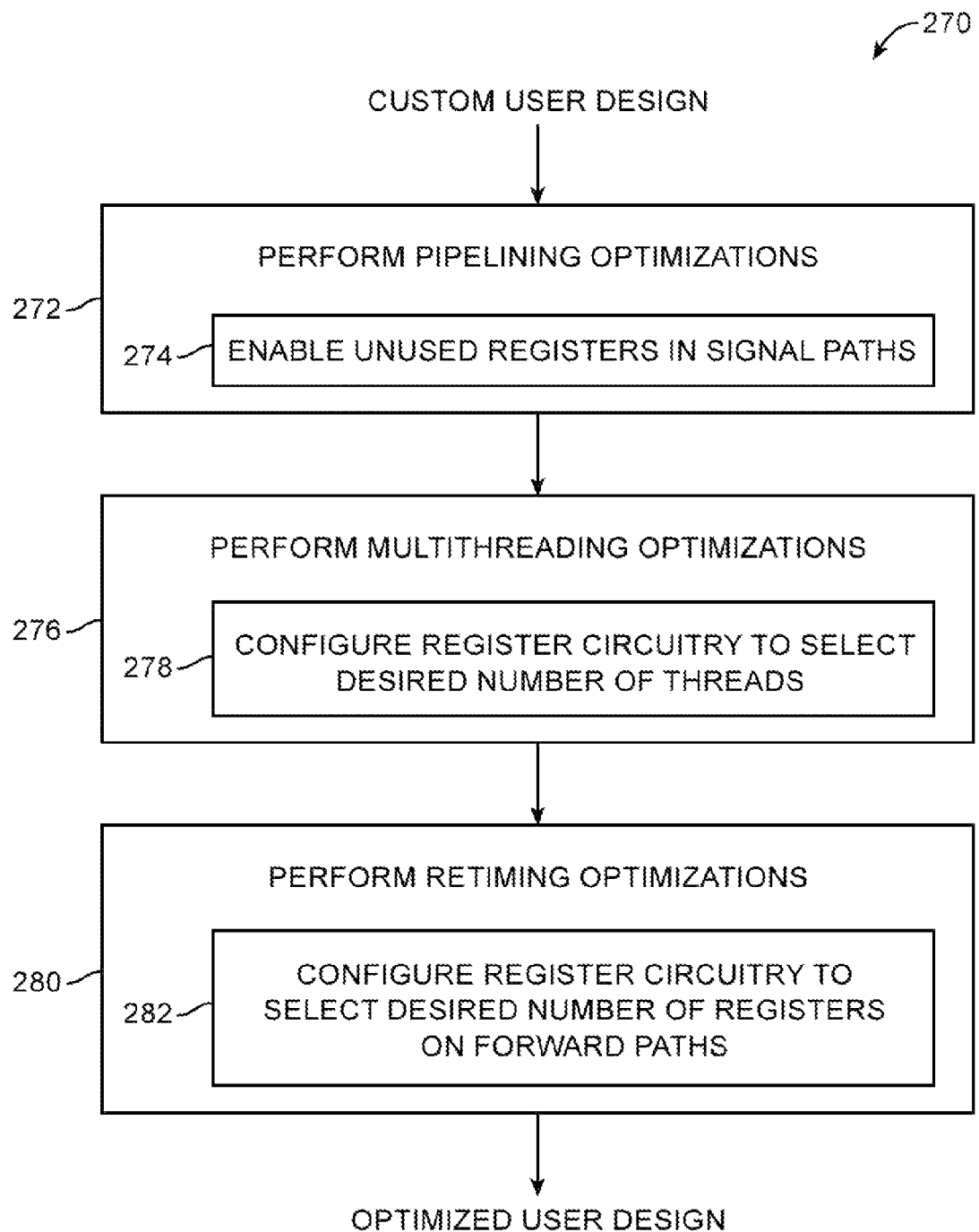
FIG. 14 is a flow chart of illustrative steps that may be performed by a logic design system in performing register optimizations using programmable register circuitry of logic regions in accordance with an embodiment of the present invention.

FIG. 14 is a flow chart 270 of illustrative steps that may be performed by a logic design system in performing register optimizations on a custom user design (e.g., in performing the operations of step 260 of FIG. 13). The logic design system may generate an optimized user design including configuration data that may be used to configure programmable register circuitry to implement the register optimizations.

During step 272, the logic design system may perform pipelining optimizations to help improve performance of the custom user design. For example, during step 274, one or more unused registers in a signal path such as those originally bypassed in the custom user design may be enabled. Consider the scenario in which logic 88 of FIG. 5 includes multiple programmable regions each having register circuitry 54 of FIG. 7 with bypassed registers 142 (e.g., the multiplexer 150 of each register circuitry 54 is configured to select the output of multiplexer 146 instead of the output of register 142). In this scenario, the logic design system may enable registers 142 of two logic regions to serve as pipelining registers 90 and 92 of FIG. 5. Registers 142 of the two logic regions may be enabled by configuring multiplexer 150 of each region to select the output of register 142 of that region.

During step 276, the logic design system may perform multithreading optimizations on the custom user design. For example, logic regions that are used to implement the custom user design may be configured to implement multithreading optimizations as described in connection with FIG. 10. The logic design system may implement a desired number of threads by configuring register circuitry of the logic regions. For example, logic regions having register circuitry 54 of FIG. 10 may be configured for a desired number of threads by programming thread selection multiplexers 226 and 228 to select the corresponding number of registers.

During step 280, the logic design system may perform retiming optimizations on the custom user design. Retiming optimizations such as described in the example of FIG. 4 may be performed by selectively enabling and disabling (e.g., bypassing) registers to distribute registers more evenly in the custom user design. Clock enable functionality of bypassed registers may be maintained by clock enable feedback paths for the bypassed registers. During step 282, the logic design system may configure register circuitry of logic regions to select desired numbers of registers on forward paths (e.g., as described in connection with FIGS. 10 and 11).

During the operations of steps 272, 276, and 280, registers of an initial design may be relocated or removed or new registers may be added. Therefore, when modifying registers of the initial design, the logic design system may identify appropriate timing of register control signals (e.g., delay amounts) to accommodate the modifications. The logic design system may program adjustable delay circuits of register circuitry in the optimized design to help maintain correct timing and functionality.

The example of FIG. 14 in which pipelining, multithreading, and retiming optimizations are performed by a logic design system is merely illustrative. If desired, any combination of one or more register optimizations may be performed in any desired order by the logic design system.

The foregoing is merely illustrative of the principles of this invention and various modifications can be made by those skilled in the art without departing from the scope and spirit of the invention. The foregoing embodiments may be implemented individually or in any combination.

What is claimed is:
1. An integrated circuit, comprising:
a plurality of logic regions;
a plurality of interconnects that couple the plurality of logic regions, wherein each of the plurality of logic regions comprises:
a register having an input and an output; and
a clock enable feedback loop circuit that couples the output of the register to the input of the register.
2. The integrated circuit defined in claim 1 wherein the integrated circuit comprises a programmable integrated circuit, wherein the plurality of logic regions comprise a plurality of programmable logic regions, and wherein the plurality of interconnects comprise a plurality of programmable interconnects.
3. The integrated circuit defined in claim 2 wherein each of the plurality of logic regions further comprises:
a look-up table that receives logic region input signals from the plurality of interconnects and produces a look-up table output signal at a look-up table output, wherein the input of the register is coupled to the look-up table output.
4. The integrated circuit defined in claim 3 wherein the clock enable feedback loop circuit of each programmable logic region comprises:
a clock enable multiplexer having a first multiplexer input coupled to the look-up table output, a second multiplexer input coupled to the output of the register, and a multiplexer output coupled to the input of the register.
5. The integrated circuit defined in claim 4 wherein each of the plurality of programmable logic regions receives a clock enable signal that controls the clock enable multiplexer to select between the first and second multiplexer inputs.

6. The integrated circuit defined in claim 5 wherein each of the plurality of programmable logic regions further comprises:
an adjustable delay circuit that delays the clock enable signal by an adjustable amount and provides the delayed clock enable signal to the clock enable multiplexer.

7. The integrated circuit defined in claim 6 wherein the adjustable delay circuit of each programmable logic region comprises a first adjustable delay circuit and wherein each of the plurality of programmable logic regions further comprises:
a second adjustable delay circuit that receives a synchronous clear signal and produces a delayed synchronous clear signal that controls the register.

8. The integrated circuit defined in claim 7 wherein each of the plurality of programmable logic regions further comprises:
a third adjustable delay circuit that receives the look-up table output signal and provides a delayed look-up table output signal for the register.

9. The integrated circuit defined in claim 1 wherein the register of each logic region is included in a plurality of registers coupled in series, the logic region further comprising:
a forward path selection multiplexer that receives a register signal from each of the plurality of registers and selects a logic region output signal from the register signals.

10. The integrated circuit defined in claim 9 wherein the clock enable feedback loop circuit of each of the plurality of logic regions comprises:
a feedback multiplexer that receives the register signals from the plurality of registers; and
a clock enable multiplexer having a first multiplexer input coupled to the look-up table output, a second multiplexer input coupled to the feedback multiplexer, and a multiplexer output coupled to the input of the register.

11. The integrated circuit defined in claim 9 wherein each of the plurality of logic regions further comprises:
an additional forward path selection multiplexer that receives the register signals and selects an additional logic region output signal from the register signals.

12. Circuitry, comprising:
a plurality of logic regions;
input selection circuitry that selects at least one control signal from a plurality of signals and provides the selected control signal to each of the plurality of logic regions; and
delay circuitry that produces a set of delayed versions of the selected control signal and provides the set of delayed control signals to each of the plurality of logic regions.

13. The circuitry defined in claim 12 wherein the selected control signal comprises a register control signal selected from the group consisting of: a synchronous load signal, a synchronous clear signal, and a clock enable signal.

14. The circuitry defined in claim 12 wherein each logic region of the plurality of logic regions comprises:
a look-up table that produces an output signal at a look-up table output;
a register having a register input coupled to the look-up table output and a register output; and
a multiplexer that receives the selected control signal and the set of delayed control signals and produces a register control signal for the register.

15. The circuitry defined in claim 14 wherein the register control signal comprises a clock enable signal wherein each logic region of the plurality of logic regions further comprises:
a clock enable multiplexer having a first input coupled to the look-up table output, a second input coupled to the register output, a control input that receives the clock enable signal, and an output that provides a register input signal to the register input.

16. The circuitry defined in claim 15 wherein each logic region of the plurality of logic regions further comprises:
an output multiplexer that receives the register input signal over a register bypass path, receives a register output signal, and produces an output for that logic region.

17. The circuitry defined in claim 12 wherein each logic region of the plurality of logic regions further comprises:
at least one additional register coupled in series with the register; and
a thread selection multiplexer that receives a register output signal from each of the registers and produces an output for that logic region.

18. A programmable integrated circuit, comprising:
a plurality of programmable logic regions each including a register and adjustable delay circuitry that adjusts timing of a control signal provided to the register, wherein the adjustable delay circuitry delays the control signal by a first amount in a first mode, wherein the adjustable delay circuitry delays the control signal by a second amount in a second mode, and wherein the first amount is different from the second amount.

19. The programmable integrated circuit defined in claim 18 wherein each programmable logic region of the plurality of programmable logic regions comprises:
look-up table circuitry that receives programmable logic input signals and produces a look-up table output signal at a look-up table output, wherein the register has a register input that is coupled to the look-up table output.

20. The programmable integrated circuit defined in claim 19 wherein each programmable logic region of the plurality of programmable logic regions further comprises:
a multiplexer that is interposed between the look-up table output and the register input; and
a feedback path that is coupled between the register output and an input of the multiplexer.

21. A method of using logic design equipment to configure a programmable integrated circuit that comprises a plurality of logic regions each having a register and a register bypass path and a clock enable feedback loop circuit for the register, the method comprising:
identifying register optimizations in the custom logic design; and
generating configuration data that configures the register bypass paths and clock enable feedback loop circuits of the plurality of logic regions to implement the identified register optimizations.

22. The method defined in claim 21 wherein identifying the register optimizations in the custom logic design comprises:
performing retiming optimizations to identify optimized register locations in the plurality of logic regions, wherein the generated configuration data configures the register bypass paths of the plurality of logic regions to place registers at the optimized register locations in the plurality of logic regions.

23. The method defined in claim 21 wherein identifying the register optimizations in the custom logic design comprises:

performing pipelining optimizations that add registers to the custom logic design, wherein the generated configuration data configures the register bypass paths of the plurality of logic regions to enable the added registers.

24. The method defined in claim 21 wherein the register of each of the plurality of logic regions comprises one of a set of series-connected registers for that logic region, wherein each logic region of the plurality of logic regions comprises a thread selection multiplexer that receives register output signals from the set of series-connected registers of that logic region, and wherein identifying the register optimizations in the custom logic design comprises:

performing multithreading optimizations that identify a thread count for a logic region of the plurality of logic regions, wherein the generated configuration data configures the thread selection multiplexer of that logic region to select from the register output signals based on the identified thread count.

25. The method defined in claim 24 wherein each logic region of the plurality of logic regions further comprises a forward path selection multiplexer that receives the register output signals and produces a logic region output signal and wherein the generated configuration data configures the forward path selection multiplexer to select the logic region output signal from the register output signals based on the identified thread count.

26. The method defined in claim 21 wherein the programmable integrated circuit includes delay circuitry that provides register control signals for the registers of the plurality of logic regions, the method further comprising:

identifying optimized delay amounts for the register control signals based on the register optimizations, wherein the generated configuration data configures the delay circuitry to provide the register control signals to the registers of the plurality of logic regions with the optimized delay amounts.

* * * * *